(12) United States Patent
Morkner

(10) Patent No.: US 7,232,708 B2
(45) Date of Patent: Jun. 19, 2007

(54) MULTI-MODE INTEGRATED CIRCUIT STRUCTURE

(75) Inventor: Henrik Morkner, Palo Alto, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 81 days.

(21) Appl. No.: 11/165,865

(22) Filed: Jun. 24, 2005

(65) Prior Publication Data

US 2005/0248021 A1  Nov. 10, 2005

Related U.S. Application Data

(62) Division of application No. 10/841,752, filed on May 6, 2004.

(51) Int. Cl.
*H01L 25/16* (2006.01)

(52) U.S. Cl. .............................. 438/109; 257/E25.029

(58) Field of Classification Search ................ 257/725, 257/726, E25.006, E25.027, E25.029, E25.03, 257/E25.031, E25.032
See application file for complete search history.

(56) References Cited

U.S. PATENT DOCUMENTS

| | | | |
|---|---|---|---|
| 4,316,203 A | 2/1982 | Tohgei | |
| 4,567,575 A | 1/1986 | Morihisa et al. | |
| 4,701,937 A | 10/1987 | Wan et al. | |
| 5,192,920 A | 3/1993 | Nelson et al. | |
| 5,406,096 A * | 4/1995 | Malhi | 257/114 |
| 5,793,116 A | 8/1998 | Rinne et al. | |
| 6,097,096 A * | 8/2000 | Gardner et al. | 257/777 |
| 6,288,613 B1 | 9/2001 | Bennett | |
| 6,306,686 B1 | 10/2001 | Horton et al. | |
| 6,373,318 B1 * | 4/2002 | Dohnke et al. | 327/427 |
| 6,555,917 B1 * | 4/2003 | Heo | 257/777 |

* cited by examiner

*Primary Examiner*—Carl Whitehead, Jr.
*Assistant Examiner*—Jennifer M. Dolan

(57) ABSTRACT

A multi-mode integrated circuit structure. In one embodiment, an integrated circuit structure includes a first die having at least one first component disposed on a face, the first die fabricated using a first process that is optimal for operating the component in an first mode and a second die stacked on the first die, the second die having at least one second component disposed on a face and the second die fabricated using a second process separate from the first process that is optimal for operating the second component in a second mode. As such, the integrated circuit structure provides an electronic device with a single integrated circuit structure for performing operations optimally in more than one mode, such as operations in enhancement mode and operations in depletion mode.

5 Claims, 3 Drawing Sheets

MULTI-MODE INTEGRATED CIRCUIT STRUCTURE

This is a Divisional of copending application Ser. No. 10/841,752 filed on May 6, 2004, the entire disclosure of which is incorporated herein by reference.

BACKGROUND OF THE INVENTION

High-frequency, electronic devices are commonly required to operate at frequencies up to 100 GHz during the normal course of operation. For example, cellular phones, wireless-Local-Area-Networks (LANs), digital-radio links, military radar, and many other high frequency applications typically have operations therein using frequencies typically up to 100 GHz. Because such high frequencies are used during operation, integrated circuits (ICs, sometimes referred to as Monolithic Microwave Integrated Circuits or MMICs in high-frequency applications) are typically fabricated from Gallium Arsenide (GaAs) as opposed to silicon as it is well known that GaAs is better suited for high-frequency applications.

It is also well known that GaAs (or other semiconductor materials, such as silicon) can be fabricated in wafers that are optimal for enhancement mode operation or depletion mode operation. Enhancement mode and depletion mode are realized by the nature of the fabrication process and each offers advantages over the other depending upon the application required by wafer-level components. For example, a wafer fabricated to be optimal for depletion mode is better suited for components such as switches, low-noise amplifiers, and DC current sources. On the other hand, a wafer fabricated to be optimal for enhancement mode is better suited for components such as linear or power amplifiers, simple digital logic, and DC current mirrors. Thus, because each mode provides certain advantages, it is desirable to have each mode available for operations in an electronic device. Operating an electronic device with both modes available is often called enhancement/depletion (E/D) mode operation. Fabricating wafers separately as either enhancement mode or depletion mode is well-known in the industry.

In the past, ICs were fabricated (in wafer form) to be optimal for performance in either enhancement or depletion mode. In more recent advances, some ICs were fabricated with two regions, where a first region was fabricated to be optimal for enhancement mode and the other region was fabricated to be optimal for depletion mode. However, because of the nature of the etching process involved with fabricating the wafer, it proved to be difficult to fabricate ICs from GaAs for optimal use in both modes. As a result, a typical IC fabricated for use in devices requiring E/D mode would sacrifice optimal performance in the least-application-significant mode. That is, a designer would choose optimal performance in depletion mode at the expense of optimal performance in enhancement mode or vice versa. In high-frequency applications, optimal performance in both modes becomes more important than in lower-frequency applications.

As advances were made in etching and masking, wafers having one area optimized for enhancement mode and another area optimized for depletion mode were able to be fabricated. Using a single substrate of GaAs, a complicated etching and masking process can be accomplished, albeit expensively and laboriously. This is because GaAs epitaxial wafers have a very complex material growth stack (layers) dedicated to only MESFET components and the like for use in depletion or enhancement mode. To grow an E/D mode wafer, the epitaxial material must be grown as two complete stacks (one for enhancement mode, one for depletion mode). The fabrication process is further complicated with separation layers that provide various etch stop (or another barrier technique) to isolate the enhancement region from the depletion region. Often, such epitaxial material is very difficult to work with and expensive such that compromises must be made at the cost of performance or isolation of the regions. The fabrication process is still further complicated by complex etching techniques that must be employed to select the buried material in one region or the other for the particular transistors needed. Thus, fabricating a single wafer to have two different regions for enhancement mode and depletion mode is expensive, time-consuming, and difficult.

Another solution has been to use two different ICs in an electronic device; one for enhancement mode and one for depletion mode. This solution, however, requires two separate ICs and additional off-chip wire bonding such that the benefit of the high frequencies available using GaAs is lost in the wire bonding.

As such, it is desirable to have an easily-fabricated, wafer-level, MMIC capable of providing optimal performance in both enhancement mode and depletion mode and fabricated from GaAs or another semiconductor suitable for use in high-frequency applications.

SUMMARY OF THE INVENTION

An embodiment of the present invention is directed to an integrated circuit structure having a first die with at least one first component disposed on its face wherein the first die is fabricated using a first process that is optimal for operating the component in an first mode, such as enhancement mode. The integrated circuit structure further has a second die stacked on the first die wherein the second die has at least one second component disposed on its face and is fabricated using a second process separate from the first process that is optimal for operating the second component in a second mode, such as depletion mode. As such, the integrated circuit structure provides an electronic device with a single integrated circuit structure for performing operations optimally in more than one mode, such as operations in enhancement mode and operations in depletion mode.

The integrated circuit structure may have each die, the first and the second arranged adjacent to each other such that the face of each die is facing the same direction or the face of each die is facing the other. In either case, since each die is separately fabricated for optimal performance in a particular mode, the integrated circuit structure may be used in applications requiring optimal performance in both enhancement and depletion modes without the high cost and complexity of fabricating a single wafer having two regions for two different modes.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

As was discussed briefly above, typical ICs may be fabricated according to well-known processes to be optimal for different modes of operation such as enhancement mode operation or depletion mode operation. Since fabrication processes are well-known, they will not be discussed in detail here. Further, it is well known that ICs are manufactured in bulk on wafers. After fabrication, the wafer is cut or diced into several ICs. By conventional terms, an IC refers to a single die cut from a fabricated wafer. As used herein, an IC or an MMIC may refer to an integrated circuit structure that comprises more than one die wherein each die may be fabricated to be optimal in one or more modes. Thus, various embodiments of the invention may comprise more than one conventional IC, but are still operable for use in electronic devices as an IC, an MMIC, a wafer-level package, and/or a low-profile integrated-circuit structure.

Figure 1:
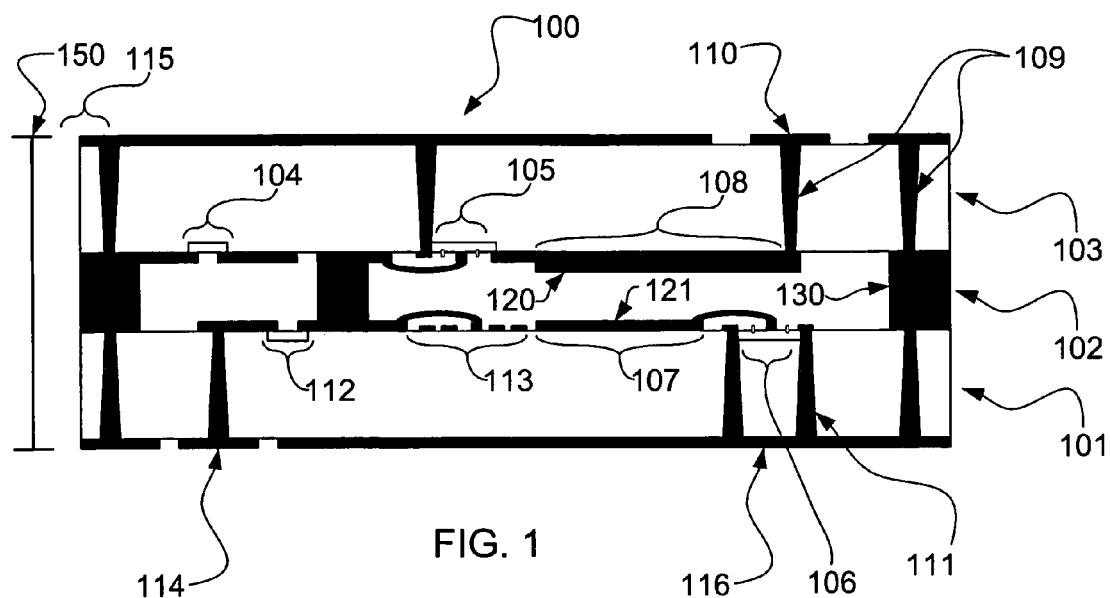
FIG. 1 is a cross-sectional view of an MMIC optimized for use in an E/D mode application according to an embodiment of the invention.

FIG. 1 is a cross-sectional view of an MMIC 100 optimized for use in an E/D mode application according to an embodiment of the invention. The MMIC 100 includes three "layers." That is, the MMIC 100 includes a top die 103 cut from a first wafer fabricated from a first process, a bottom die 101 cut from a second wafer fabricated from a second process, and an interconnect layer 102. After separate fabrication, both wafers are attached to each other such that the top die 103 and bottom die 101 are formed after the MMIC 100 has been cut from the assembled wafers. This attaching process is described in greater detail below. Since typical ICs are manufactured in bulk by fabricating an entire wafer, each MMIC (only MMIC 100 is shown in FIG. 1) is separated by dicing channels 115 such that the MMICs may be cut and separated after fabrication.

In one embodiment, the top die 103 is formed from a wafer that has been fabricated using a process that optimizes the wafer for enhancement mode use. Likewise, the bottom die 101 is formed from a wafer that has been fabricated from a process that optimizes the wafer for depletion mode use. Of course, in another embodiment, the top die 103 optimized for depletion mode use and the bottom die 101 is optimized for enhancement mode use. In either case, the top die 103 is stacked on the bottom die 101 and separated by the interconnect layer 102.

In this embodiment, the top die 103 is stacked on the bottom die 101 in a face-to-face manner and separated by the interconnect layer 102. That is, the component side 120 of the top die 103 is facing toward the component side 121 of the bottom die 101. The top and bottom dies 103 and 101 are electrically isolated by the interconnect layer 102, and the top die 103 is supported by non-conductive spacers 130.

The interconnect layer 102 is at least as thin as the top die 103 and the bottom die 101 such that entire height 150 of the MMIC 100 is greater than the height of a conventional IC, but not so much so that the low-profile advantage of a conventional IC is lost. Thus, the MMIC 100 may be said to be "three-dimensional" as components and signals propagating through them are on either the top die 103 or the bottom die 101. Even though the height 150 of the MMIC 100 may be greater than a conventional IC, the height 150 is still nominal in comparison to the length and width. Thus, the MMIC 100 is still short enough to be considered a wafer-level package.

Typical microwave components may be formed during standard fabrication on either the top or bottom dies 103 and 101. These components may be, but are not limited to Field Effect Transistors (FETS) 105 and 106, capacitors 107, inductors 113, resistors 112 and 104, and/or transmission lines 108. Electrical interconnections may be made using conventional vias 109 through the top die 103 or vias 111 through the bottom die 101. Bond pads 110 and 114 can either be located on the bottom die 101 (bond pad 114) for further processing of an interconnect, such as bumping, or can be located on the top die 103, (bond pad 110), for conventional wire bonding.

As discussed previously, the top die 103 and the bottom die 101 are fabricated by two different processes and are then cut from a single wafer structure comprising two different wafers in a post-fabrication step (described below with respect to FIG. 4). As such, the specific components in each die may be tailored to operate optimally in an enhancement or depletion mode such that optimal operation corresponds to the respective die 101 or 103. For example, the bottom die 101 may be fabricated for optimal performance in enhancement mode. As such, a FET 106 fabricated in the bottom die 101 would also be fabricated for optimal performance in enhancement mode. Likewise, the top die 103 may be fabricated for optimal performance in depletion mode. As such, a FET 105 fabricated in the top die 103 would also be fabricated for optimal performance in depletion mode. In this manner, an electronic device having the MMIC 100 therein may gain the benefit of both enhancement mode operations and depletion mode operations because components optimized for each are provided on a single, wafer-level package. As described below with respect to FIGS. 2 and 3, there are other ways to realize a single, wafer-level E/D mode package as well.

Figure 2:
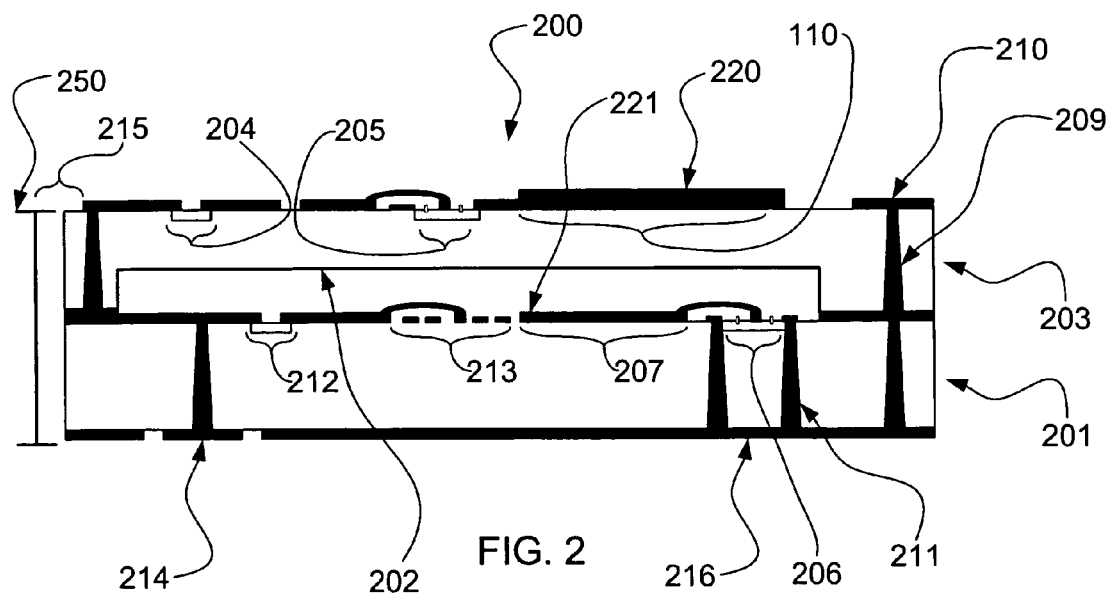
FIG. 2 is a cross-sectional view of another MMIC optimized for use in an E/D mode application according to another embodiment of the invention.

FIG. 2 is a cross-sectional view of another MMIC 200 optimized for use in an E/D mode application according to another embodiment of the invention. In this embodiment, the top die 203 and the bottom die 201 are stacked such that the component sides 220 and 221 of each die 201 and 203 are facing the same direction. As is the case with the MMIC 100 of FIG. 1, the MMIC 200 of FIG. 2 also includes three layers. Thus, the MMIC 200 includes a top die 203 cut from a first wafer fabricated from a first process, a bottom die 201 cut from a second wafer fabricated from a second process and an electrically-isolating cavity 202. Again, since typical MMICs are manufactured in bulk by fabricating an entire wafer, each MMIC (only MMIC 200 is shown in FIG. 2) is separated by dicing channels 215.

In one embodiment, the top die 203 is fabricated from a process that optimizes the wafer for enhancement mode use and the bottom die 201 is fabricated from a process that optimizes the wafer for depletion mode use. Of course, in another embodiment, the top die 203 is fabricated from a process that optimizes the wafer for depletion mode use and the bottom die 201 is fabricated from a process that optimizes the wafer for enhancement mode use. In either case, the top die 203 is stacked on the bottom die 201 which then forms the electrically-isolating cavity 202 between them.

In this embodiment, the top die 203 is stacked on the bottom die 201 in a face-to-back manner wherein the electrically-isolating cavity 202 is formed between the dies 201 and 203. That is, the component side 220 of the top die 203 is facing the same direction as the component side 221 of the bottom die 201. Some portions of the top and bottom dies 203 and 201 are electrically isolated by the electrically-isolating cavity 202, except for a few support areas near the dicing channels 215 at the edges of the MMIC 200.

The height of the electrically-isolating cavity 202 is entirely within the height of the top die 203 such that entire height 250 of the MMIC 200 is about the height of two conventional ICs. Thus, the MMIC 100 may be said to be three-dimensional as components and signals propagating through them are on either the top die 203 or the bottom die 201. Even though the height 250 of the MMIC 200 may be twice that of a conventional IC, the height 250 is still nominal in comparison to its length and width. Thus, the MMIC 200 is still short enough to be considered a wafer-level package.

Typical microwave components may be formed during standard fabrication on either the top or bottom dies 203 and 201. These components may be, but are not limited to Field Effect Transistors (FETs) 205 and 206, capacitors 207, inductors 213, resistors 212 and 204, and/or transmission lines 208. Electrical interconnections may be made using conventional vias 209 through the top die 203 or vias 211 through the bottom die 201. Bond pads 210 and 214 can either be located on the bottom die 201 (bond pad 214) for further processing of an interconnect, such as bumping, or can be located on the top die 203, (bond pad 210), for conventional wire bonding.

As discussed previously, the top die 203 and the bottom die 201 are fabricated by two different processes and are then cut from a single wafer structure comprising two different wafers in a post-fabrication step (described below with respect to FIG. 4). As such, the specific components in each die may be tailored to operate optimally in an enhancement or depletion mode such that optimal operation corresponds to the respective die 201 or 203. For example, the bottom die 201 may be fabricated for optimal performance in enhancement mode. As such, a FET 206 fabricated in the bottom die 201 would also be fabricated for optimal performance in enhancement mode. Likewise, the top die 203 may be fabricated for optimal performance in depletion mode. As such, a FET 205 fabricated in the top die 203 would also be fabricated for optimal performance in depletion mode. In this manner, an electronic device having the MMIC 200 therein may gain the benefit of both enhancement mode operations and depletion mode operations because components optimized for each are provided on a single, wafer-level package.

Figure 3:
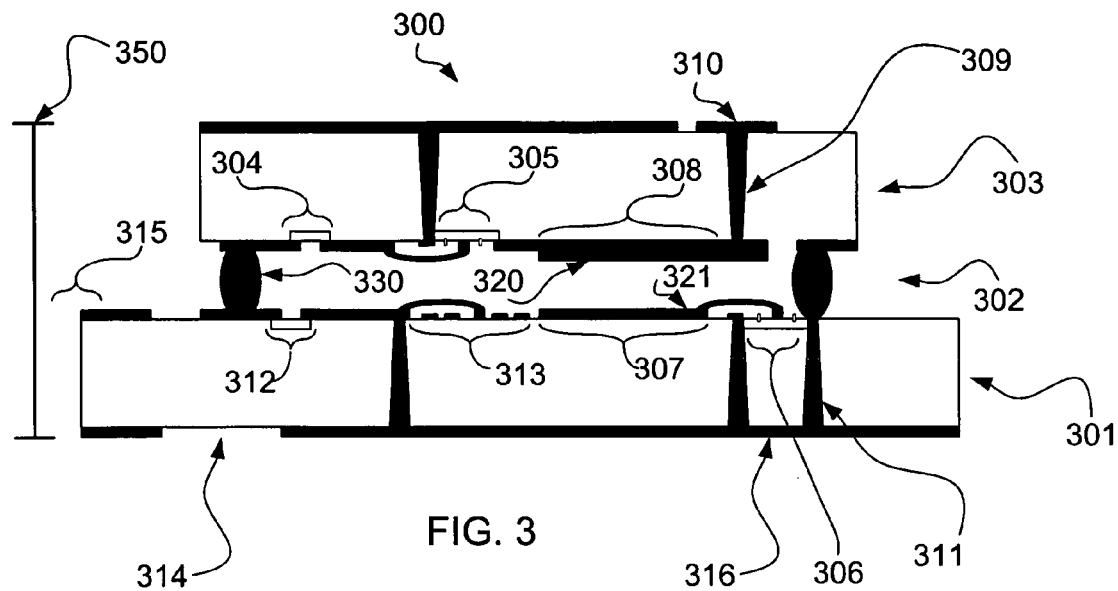
FIG. 3 is a cross-sectional view of yet another MMIC optimized for use in an E/D mode application according to yet another embodiment of the invention.

FIG. 3 is a cross-sectional view of another MMIC 300 optimized for use in an E/D mode application according to another embodiment of the invention. In this embodiment, the top die 303 and the bottom die 301 are again stacked such that the component sides 320 and 321 of each die 301 and 303 are facing the same direction. Here, however, the two dies 301 and 303 are separated by a support layer 302 such that the first die is supported above the bottom die by non-conductive ball supports 319 (or post supports). Thus, the MMIC 300 includes a top die 303 cut from a first wafer fabricated from a first process, a bottom die 301 cut from a second wafer fabricated from a second process and the support layer 302. Again, since typical MMICs are manufactured in bulk by fabricating an entire wafer, each MMIC (only MMIC 300 is shown in FIG. 3) is separated by dicing channels 315.

In one embodiment, the top die 303 is fabricated from a process that optimizes the wafer for enhancement mode use and the bottom die 301 is fabricated from a process that optimizes the wafer for depletion mode use. Of course, in another embodiment, the top die 303 is fabricated from a process that optimizes the wafer for depletion mode use and the bottom die 301 is fabricated from a process that optimizes the wafer for enhancement mode use. In either case, the top die 303 is stacked on the bottom die 301 and separated by the interconnect layer 302.

In this embodiment, the top die 303 is stacked on the bottom die 303 in a face-to-back manner and separated by the support layer 302. That is, the component side 320 of the top die 303 is facing in the same direction as the component side 321 of the bottom die 301. The top and bottom dies 303 and 301 are electrically isolated by the interconnect layer 302, except for non-conductive ball supports 330 (or non-conductive posts that are not shown) that provide a support structure for holding the top die 103 stacked in place above the bottom die 101. This particular embodiment is well suited for using a top die 303 that is smaller than the bottom die 302. Thus, if only a few components are needed in the top die 303 (such as only a few switches better suited for depletion mode operation), the top die 303 need not be as large as the bottom die (which may require more space for many power amplifiers in an enhancement mode).

The height of the support layer 302 is about the same as the height of a typical IC such that entire height 350 of the MMIC 300 is greater than a conventional IC, but again, not so much so that the low-profile advantage of an IC is lost. Thus, the MMIC 300 may be said to be three-dimensional as components and the signals propagating through them are on either the top die 303 or the bottom die 301. Even though the height 350 of the MMIC 300 may be greater than a conventional IC, the height 350 is still nominal in comparison to its length and width. Thus, the MMIC 300 is still short enough to be considered a wafer-level package.

Typical microwave components may be formed during standard fabrication on either the top or bottom dies 303 and 301. These components may be, but are not limited to Field Effect Transistors (FETs) 305 and 306, capacitors 307, inductors 313, resistors 312 and 304, and/or transmission lines 308. Electrical interconnections may be made using conventional vias 309 through the top die 303 or vias 311 through the bottom die 301. Bond pads 310 and 314 can either be located on the bottom die 301 (bond pad 314) for further processing of an interconnect, such as bumping, or can be located on the top die 303, (bond pad 310), for conventional wire bonding.

As discussed previously, the top die 303 and the bottom die 301 are fabricated by two different processes and are cut from a single structure comprising the two different wafers. As such, the specific components in each die may be tailored to operate optimally in an enhancement or depletion mode such that optimal operation corresponds to the respective die 301 or 303. For example, the bottom die 301 may be fabricated for optimal performance in enhancement mode. As such, a FET 306 fabricated in the bottom die 301 would also be fabricated for optimal performance in enhancement mode. Likewise, the top die 303 may be fabricated for optimal performance in depletion mode. As such, a FET 305 fabricated in the top die 303 would also be fabricated for optimal performance in depletion mode. In this manner, once again, an electronic device having the MMIC 200 therein may gain the benefit of both enhancement mode operations and depletion mode operations because components optimized for each are provided on a single, wafer-level package.

Figure 4:
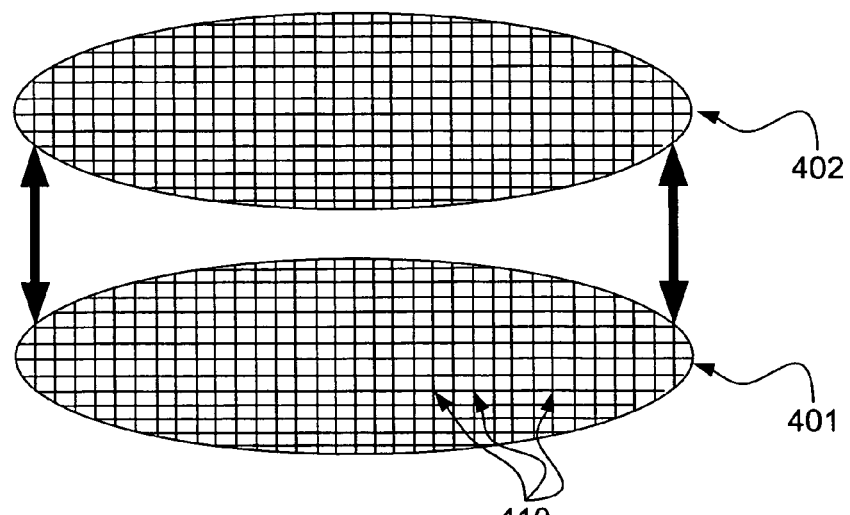
FIG. 4 shows a first wafer and a second wafer having exaggerated MMICs therein prior to being pressed together during a manufacturing process according to an embodiment of the invention.

FIG. 4 shows a first wafer 401 and a second wafer 402 having exaggerated MMICs 410 thereon prior to being pressed together during a manufacturing process according to an embodiment of the invention. As was mentioned previously, wafers are typically fabricated to be optimal for enhancement mode or for depletion mode. For example, in FIG. 4 the top wafer 401 may be fabricated to be optimal for enhancement mode operation while the bottom wafer 402 may be fabricated to be optimal for depletion mode operation. Once fabricated, each wafer 401 and 402 will have thousands of MMICs 410 each separated by dicing channels (not shown in detail, but may be thought of as the lines on each wafer) such that each one may be cross-cut from the wafer for use in an application. The MMICs of FIG. 4 are exaggerated in size for clarity.

After the two wafers 401 and 402 are fabricated separately according to known processes for optimal enhancement or depletion mode performance, the two wafers 401 and 402 are pressed together to form multiple MMICs, each separated by dicing channels. After forming the multiple MMICs 410 by pressing the wafers together, the individual MMICs 410 may be cut along the dicing channels to yield individual MMICs having top and bottom dies as described above with respect to FIGS. 1–3. Although not shown or described in detail, three wafers may be pressed together to form a single integrated-circuit structure having three dice, each die being optimized for a particular operation. Further, the modes are not limited to the well-known modes of enhancement and depletion, as any die optimized for a particular use may be used in the integrated circuit structure of the present invention.

Figure 5:
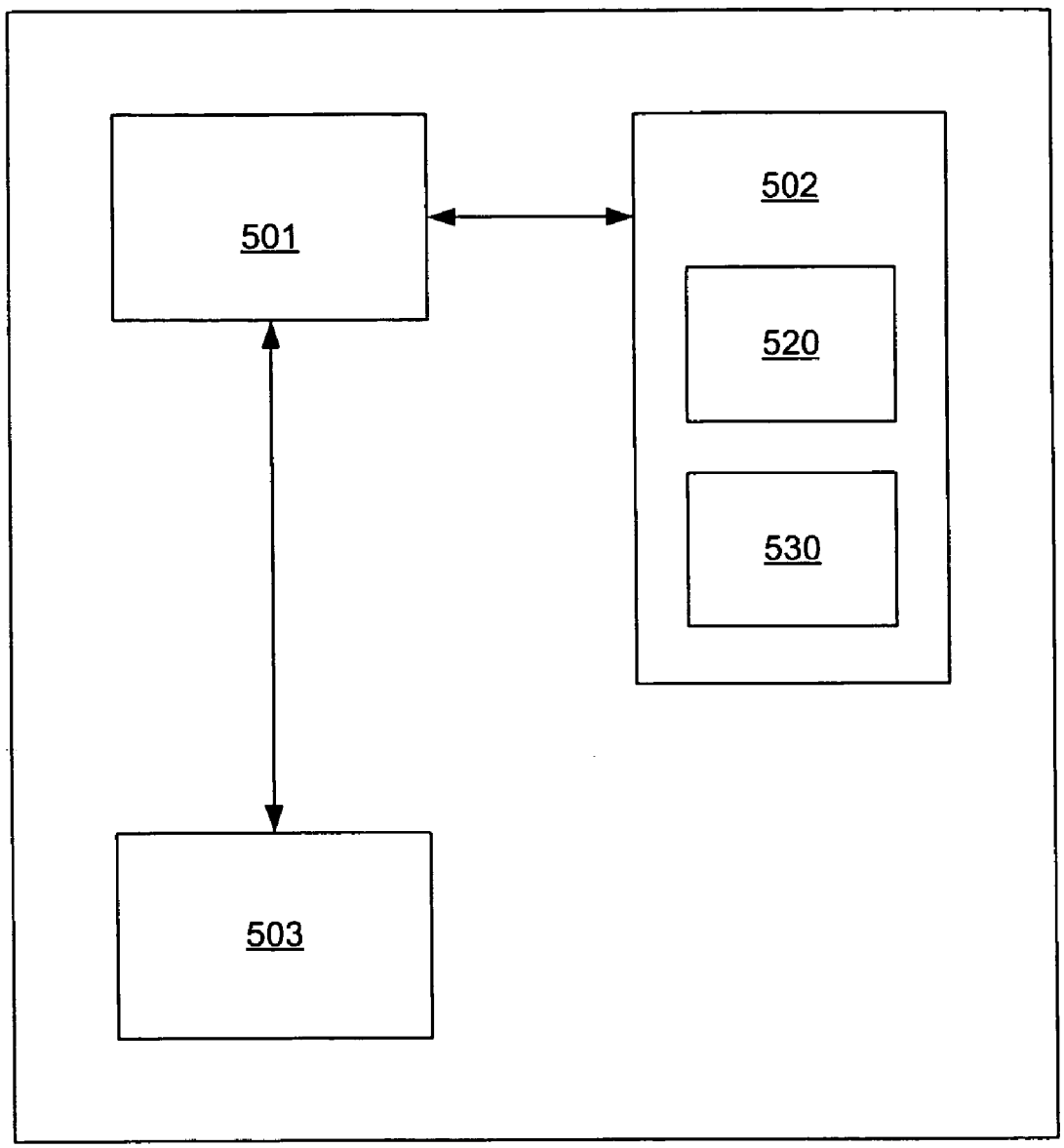
FIG. 5 is a block diagram of an electronic device having an MMIC of FIGS. 1–3 according to an embodiment of the invention.

FIG. 5 is a block diagram of an electronic device having an MMIC of FIGS. 1–3 according to an embodiment of the invention. The electronic device may be a cellular phone, wireless-Local-Area-Network (LANs), digital-radio link, military radar, or any other high-frequency application typically requiring operations therein using frequencies up to 100 GHz.

The electronic device 500 includes an MMIC 501, a microprocessor 502 and a transceiver 503. The MMIC 501 includes, as described above, two separately fabricated dies (not shown individually), each of which fabricated to have components that perform optimally in a particular mode of operation, such as enhancement mode or depletion mode. In FIG. 5, the MMIC 501 includes a switch 520 and an amplifier 530, each of which comprise various electronic components according to well-known electronic-circuit design standards. As such, the switch 520 may be formed from components in the die optimized for depletion mode while the amplifier 530 may be formed from components in the die optimized for enhancement mode. In this example, a typical application may be the combination of an amplifier and a switch into one multimode integrated circuit structure. As such, the transceiver 503 that may require an antenna switch for half duplex operation may utilize the switch 520 while the signal received by the transceiver 503 may be amplified using the amplifier 530.

In a typical application, the amplifier 530 is realized from the die optimized for enhancement mode. Other typical components not shown may include a Power Amplifier (PA), power down circuits, and switch control logic. Typical components found in the die optimized for depletion mode may include a low-noise amplifier, a current source (for RF blocking), and switches.

We claim:

1. A method of fabricating a unitary gallium arsenide monolithic microwave integrated circuit (MMIC) structure capable of operating in an enhancement/depletion (E/D) mode, comprising:

fabricating a first electronic component on a first die comprising gallium arsenide using a first fabrication process optimal for operating the first electronic component in an enhancement mode;

fabricating a second electronic component on a second die comprising gallium arsenide using a second fabrication process different from the first process, the second process being optimal for operating the second component in a depletion mode;

forming an electrically isolating interconnect layer, and adjoining the first die to the second die to form the integrated circuit structure, wherein the electrically isolating interconnect layer is disposed between the first die and the second die, the interconnect layer being configured to electrically interconnect portions of the first and second dice.

2. The method of claim 1, wherein the first die and the second die are stacked such that the combined height comprises a wafer-level height.

3. The method of claim 1 wherein the interconnect layer comprises electrically non-conductive interconnect spacers that provide electrical isolation between the first die and the second die.

4. The method of claim 1 wherein the adjoining further comprises adjoining the first die to the second in a face-to-face configuration.

5. The method of claim 1 wherein the adjoining further comprises adjoining the first die to the second in a configuration such that the face of the first die faces the same direction as the face of the second die.

* * * * *

UNITED STATES PATENT AND TRADEMARK OFFICE
CERTIFICATE OF CORRECTION

| | |
|---|---|
| PATENT NO. | : 7,232,708 B2 |
| APPLICATION NO. | : 11/165865 |
| DATED | : June 19, 2007 |
| INVENTOR(S) | : Henrik Morkner |

It is certified that error appears in the above-identified patent and that said Letters Patent is hereby corrected as shown below:

On the Title Page, Item (57)
In Abstract (line 5), delete "an" and insert -- a --.

Col. 8
In Claim 1 (line 39), delete "dice." and insert -- die. --.

Signed and Sealed this

Fifteenth Day of July, 2008

JON W. DUDAS
*Director of the United States Patent and Trademark Office*